United States Patent
Park

(10) Patent No.: US 9,466,671 B2
(45) Date of Patent: Oct. 11, 2016

(54) SEMICONDUCTOR DEVICE HAVING FIN GATE, RESISTIVE MEMORY DEVICE INCLUDING THE SAME, AND METHOD OF MANUFACTURING THE SAME

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 145 days.

(21) Appl. No.: 14/460,175

(22) Filed: Aug. 14, 2014

(65) Prior Publication Data

US 2015/0048295 A1    Feb. 19, 2015

Related U.S. Application Data

(63) Continuation-in-part of application No. 14/076,921, filed on Nov. 11, 2013, now Pat. No. 9,082,697.

(30) Foreign Application Priority Data

Aug. 19, 2013 (KR) .................. 10-2013-0097818
Apr. 28, 2014 (KR) .................. 10-2014-0050647

(51) Int. Cl.
*H01L 29/66* (2006.01)
*H01L 29/10* (2006.01)
*H01L 29/78* (2006.01)
*H01L 27/24* (2006.01)
*H01L 27/22* (2006.01)

(52) U.S. Cl.
CPC ......... *H01L 29/1054* (2013.01); *H01L 27/228* (2013.01); *H01L 27/2436* (2013.01); *H01L 29/66795* (2013.01); *H01L 29/785* (2013.01)

(58) Field of Classification Search
CPC .............................. H01L 21/762; H01L 29/07
USPC ........................................... 257/365; 438/585
See application file for complete search history.

(56) References Cited

U.S. PATENT DOCUMENTS

| | | | |
|---|---|---|---|
| 8,237,226 B2 * | 8/2012 | Okano | ................... H01L 21/324 257/368 |
| 2007/0295995 A1 * | 12/2007 | Yun | .................... H01L 27/10885 257/202 |
| 2008/0296632 A1 * | 12/2008 | Moroz | ............ H01L 21/823807 257/255 |
| 2009/0085062 A1 * | 4/2009 | Jin | .................... H01L 29/66795 257/190 |

(Continued)

FOREIGN PATENT DOCUMENTS

KR    1020060021386    3/2006
KR    1020060028575    3/2006

OTHER PUBLICATIONS

Office Action issued by the USPTO for a parent U.S. Appl. No. 14/076,921 on Oct. 7, 2014.

*Primary Examiner* — Caleb Henry
(74) *Attorney, Agent, or Firm* — IP & T Group LLP

(57) ABSTRACT

A semiconductor device having a fin gate that improves an operation current, and a method of manufacturing the same are provided. The semiconductor device includes an active pillar formed on a semiconductor substrate, and including a first region and a second region surrounding at least one surface of the first region, and a fin gate extending to overlap an upper surface and a lateral surface of the active pillar. The first region of the active pillar is formed of a semiconductor layer having a lattice constant smaller than that of the second region of the active pillar.

12 Claims, 8 Drawing Sheets

(56) References Cited

U.S. PATENT DOCUMENTS

| | | | |
|---|---|---|---|
| 2009/0256208 A1* | 10/2009 | Okano | H01L 21/324 257/365 |
| 2010/0127327 A1* | 5/2010 | Chidambarrao | H01L 29/66795 257/347 |
| 2010/0207172 A1* | 8/2010 | Masuoka | H01L 21/823807 257/255 |
| 2010/0219482 A1* | 9/2010 | Masuoka | H01L 21/845 257/369 |
| 2011/0186797 A1* | 8/2011 | Herner | G11C 17/16 257/2 |
| 2014/0061815 A1* | 3/2014 | Jagannathan | H01L 27/0924 257/369 |

* cited by examiner

SEMICONDUCTOR DEVICE HAVING FIN GATE, RESISTIVE MEMORY DEVICE INCLUDING THE SAME, AND METHOD OF MANUFACTURING THE SAME

CROSS-REFERENCES TO RELATED APPLICATION

This application is a continuation-in-part of application Ser. No. 14/076,921, filed Nov. 11, 2013, titled "Semiconductor Device Having a Vertical Channel, Variable Resistive Memory Device Including the Same and Method of Manufacturing The Same" and claims priority under 35 U.S.C. 119(a) to Korean applications No. 10-2013-0097818, filed on Aug. 19, 2013 and No. 10-2014-0050647, filed on Apr. 28, 2014, in the Korean intellectual property Office, which are incorporated by reference in its entirety as set forth in full.

BACKGROUND

1. Technical Field

The inventive concept relates to a semiconductor device and a method of manufacturing the same, and more particularly, to a PMOS transistor having a fin gate, a resistive memory device including the same, and a method of manufacturing the same.

2. Related Art

With the rapid development of mobile and digital information communication and consumer-electronic industries, studies on existing electronic charge-controlled devices may encounter limitations. Thus, new functional memory devices other than the existing electronic charge-controlled devices need to be developed. In particular, next-generation memory devices with large capacity, ultra-high speed, and ultra-low power need to be developed to satisfy demands on large capacity of memories in main information apparatuses.

Currently, variable resistive memory devices using a resistive device as a memory medium have been suggested as the next-generation memory devices. Typical examples of the variable resistive memory devices include phase-change random access memories (PCRAMs), resistive RAMs (Re-RAMs), and magneto-resistive RAMs (MRAMs).

Each of the variable resistive memory devices may include a switching device and a resistive device, and store data "0" or "1" according to a state of the resistive device.

Even in the variable resistive memory devices, the first priority is to improve integration density and to integrate as many memory cells as possible in a limited area.

To satisfy the demand, the variable resistive memory devices also employ a three-dimensional (3D) transistor structure. The 3D transistors may include a 3D vertical channel and a surrounding gate or include a 3D horizontal channel and a fin gate.

The 3D transistors may require high operation current to maintain high resistance variable characteristics.

SUMMARY

According to an exemplary embodiment, a semiconductor device is provided. The semiconductor device may include an active pillar formed on a semiconductor substrate, and including a first region and a second region surrounding at least one surface of the first region, and a fin gate extending to overlap an upper surface and a lateral surface of the active pillar, wherein the first region of the active pillar is formed of a semiconductor layer having a lattice constant smaller than that of the second region of the active pillar.

According to another exemplary embodiment, there is provided a variable resistive memory device. The variable resistive memory device may include an active pillar including an inner region, an outer region formed to surround at least one surface of the inner region, and a P-type source and drain located at both sides of the inner region, a fin gate extending to surround an upper surface and a lateral surface of the inner region of the active pillar, a gate insulating layer interposed between the active pillar and the fin gate, and a variable resistor formed to be electrically coupled to the drain, wherein the active pillar is formed in such a manner that compressive stress is caused in a junction interface between the inner region and the outer region.

According to still another exemplary embodiment, there is provided a method of manufacturing a semiconductor device. The method may include forming an active pillar on a semiconductor substrate, wherein an inner material of the active pillar has a lattice constant smaller than that of an outer material of the active pillar, forming a gate insulating layer on a surface of the active pillar, and forming a fin gate on the gate insulating layer to surround an upper surface and two lateral surfaces of the active pillar.

These and other features, aspects, and embodiments are described below.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
FIGS. 1A to 1D are cross-sectional views illustrating a method of manufacturing a PMOS transistor having a fin gate according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "coupled" refers to one component not only directly coupling another component but also indirectly coupling another component through an intermediate component.

The inventive concept is described herein with reference to cross-section and/or plan illustrations that are schematic illustrations of idealized embodiments of the inventive concept. However, the inventive concept should not be construed as limited to the embodiments. Although a few embodiments of the inventive concept will be shown and described, it will be appreciated by those of ordinary skill in the art that changes may be made in these exemplary embodiments without departing from the principles and spirit of the inventive concept.

Referring to FIG. 1A, a semiconductor substrate 200 is prepared. The semiconductor substrate 200 may be, for example, a silicon (Si) substrate containing first conductivity type impurities such as N type impurities. A first semiconductor layer 210 is deposited on the semiconductor substrate 200. The first semiconductor layer 210 may be formed of a material having a lattice constant smaller than that of the semiconductor substrate 200. In the embodiment, the first semiconductor layer 210 may include one selected from the group consisting of silicon carbide (SiC), aluminum nitride (AlN), gallium nitride (GaN), zinc sulfide (ZnS), zinc oxide (ZnO), zinc selenide (ZnSe), cadmium sulfide (CdS), boron phosphide (BP), and indium nitride (InN). The first semiconductor layer 210 may be a region in which a substantial channel is formed in a subsequent process. The thickness of the first semiconductor layer 210 may be determined by considering the length of the channel. For example, the first semiconductor layer 210 may be grown in a single crystalline structure through an epitaxial growth method. When the first semiconductor layer 210 is formed through the epitaxial growth method, hole mobility characteristics of the first semiconductor layer 210 may be improved relative to a first semiconductor layer formed in a polycrystalline structure.

Figure 1B:
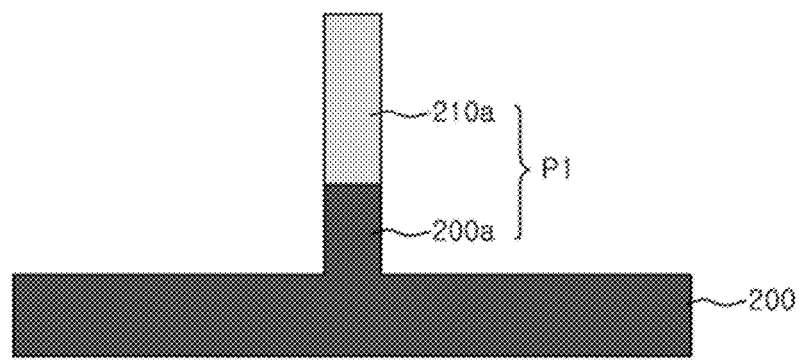

Referring to FIG. 1B, the first semiconductor layer 210 and a portion of the semiconductor substrate 200 are patterned to form a preliminary pillar P1. The reference numerals 210a and 200a denote a patterned first semiconductor layer, and a patterned portion of the semiconductor substrate, respectively. In the embodiment, the preliminary pillar P may be a structure having a certain length, that is, a structure extending in a line form.

Figure 1C:
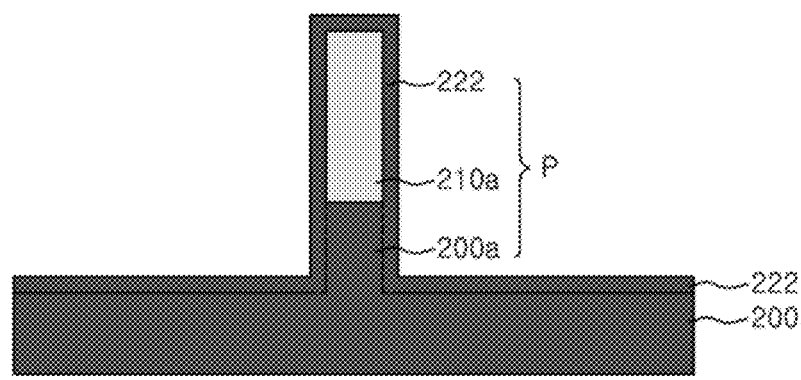

Referring to FIG. 1C, a second semiconductor layer 222 is deposited on the semiconductor substrate 200 in which the preliminary pillar P1 is formed. The second semiconductor layer 222 may be formed of the same material as the semiconductor substrate 200, for example, a silicon (Si) material. For example, the second semiconductor layer 222 may be formed through an epitaxial growth method. Thus, an active pillar P with a 3D transistor may be formed.

Figure 1D:
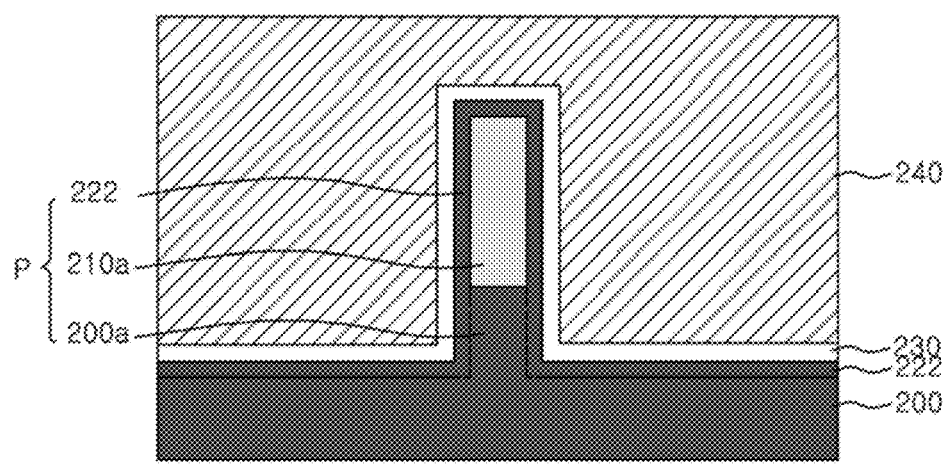

Referring to FIG. 1D, a gate insulating layer 230 and a gate conductive material (not shown) are deposited on the second semiconductor layer 222. The gate insulating layer 230 may be formed through an oxidation method of the second semiconductor layer 222. Alternatively, the gate insulating layer 230 may be formed by depositing a metal oxide layer such as a tantalum oxide (TaO) layer, a titanium oxide (TiO) layer, a barium titanate (BaTiO) layer, a barium zirconate (BaZrO) layer, a zirconium oxide (ZrO) layer, a hafnium oxide (HfO) layer, a lanthanum oxide (LaO) layer, an aluminum oxide (AlO) layer, an yttrium oxide (YO) layer, or a zirconium silicon oxide (ZrSiO) layer, or a nitride layer, or a combination thereof. For example, the gate conductive material may include at least one selected from the group consisting of tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN) zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), tantalum oxynitride (TaON), and doped polysilicon.

Figure 2:
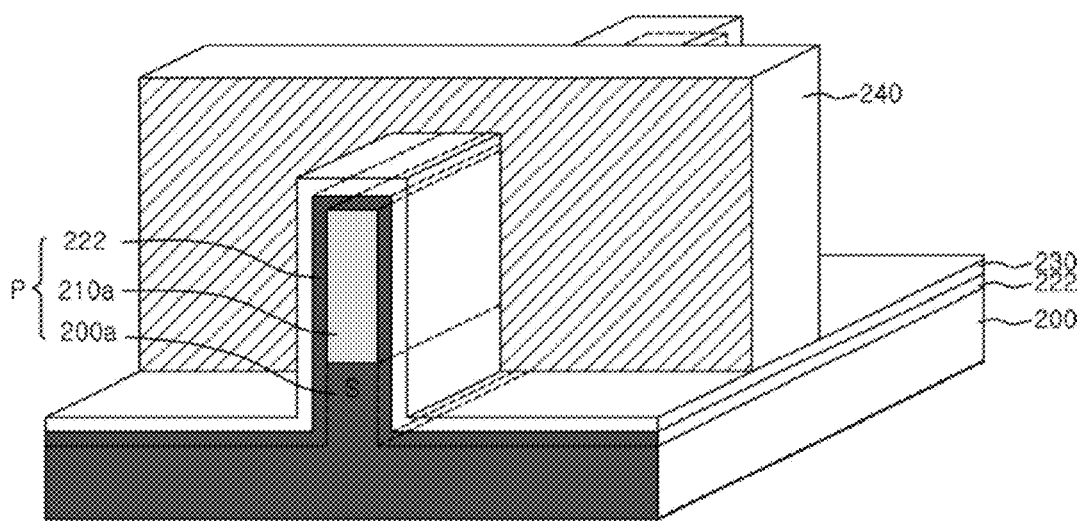
FIG. 2 is a perspective view illustrating a PMOS transistor having a fin gate according to an embodiment of the inventive concept.

Referring to FIGS. 1D and 2, the gate conductive material is patterned in a substantial line form to cross the active pillar P, and thus a fin gate 240 is formed. When the gate conductive material is patterned, the gate insulating layer 230 may be simultaneously patterned. Thus, the fin gate 240 may overlap an upper surface and both lateral surfaces of the active pillar P.

Second conductivity type impurities, for example, high concentration P type impurities (for example, Boron) are implanted into the active pillar P at both sides of the fin gate 240 to form a source S at one side of the active pillar on the basis of the fin gate 240, and to form a drain D at the other side of the active pillar P. The source S and the drain D may be formed in a lightly doped drain (LDD) manner to reduce short channel effects such as gate-induced drain leakage (GIRL).

When a variable resistive memory device is implemented, a bit line and a variable resistor may be formed to be electrically coupled to the drain D through a general method.

In the 3D transistor having the fin gate 240, the active pillar P with a channel is formed in such a manner that a semiconductor material of an inner portion of the active pillar P has a smaller lattice constant than that of an outer portion of the active pillar P. Compressive stress according to a lattice constant difference is caused in a junction interface between the inner portion and an outer portion of the active pillar P. When the compressive stress is provided to the inner portion of the active pillar P, carrier mobility of the PMOS transistor in which a hole is a major carrier may be remarkably improved. Thus, current drivability of the PMOS transistor may be improved.

Figure 3A:
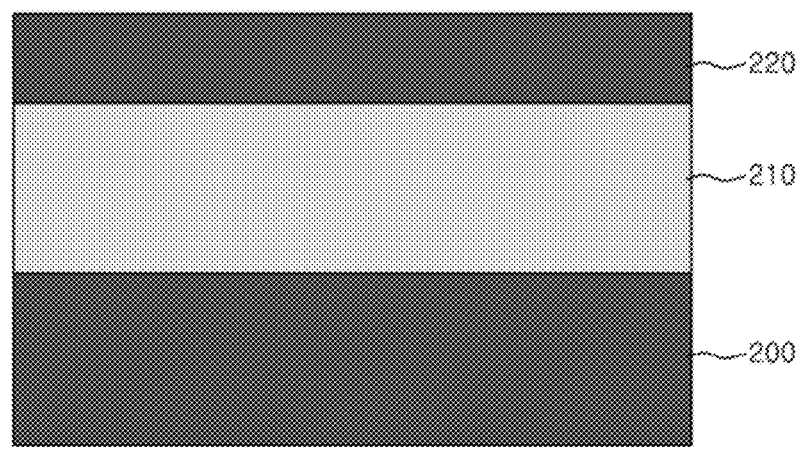
FIGS. 3A to 3E are cross-sectional views illustrating a method of manufacturing a PMOS transistor having a fin gate according to another embodiment of the inventive concept.

Referring to FIG. 3A, a semiconductor substrate 200 is prepared. The semiconductor substrate 200 may be, for example, a silicon (Si) substrate containing first conductivity type impurities such as N type impurities. The N type impurities may include phosphorus (P) or arsenic (As). A first semiconductor layer 210 and a second semiconductor layer 220 are sequentially stacked on the semiconductor substrate 200. The first semiconductor layer 210 may be formed of a material having a lattice constant smaller than that of the semiconductor substrate 200 formed of silicon (Si). The first semiconductor layer 210 may include one selected from the group consisting of SiC, AlN, GaN, ZnS, ZnO, ZnSe, CdS, BP, and InN. The first semiconductor layer 210 may be a region in which a substantial channel is to be formed in a subsequent process. A thickness of the first semiconductor layer 210 may be determined by considering a length of the channel. For example, the first semiconductor layer 210 may be grown in a single crystalline structure through an epitaxial growth method by considering hole mobility characteristics. The second semiconductor layer 220 may be formed on the first semiconductor layer 210. The second semiconductor layer 220 may be formed of the same material as that of the semiconductor substrate 200, for example, a silicon (Si) material.

Figure 3B:
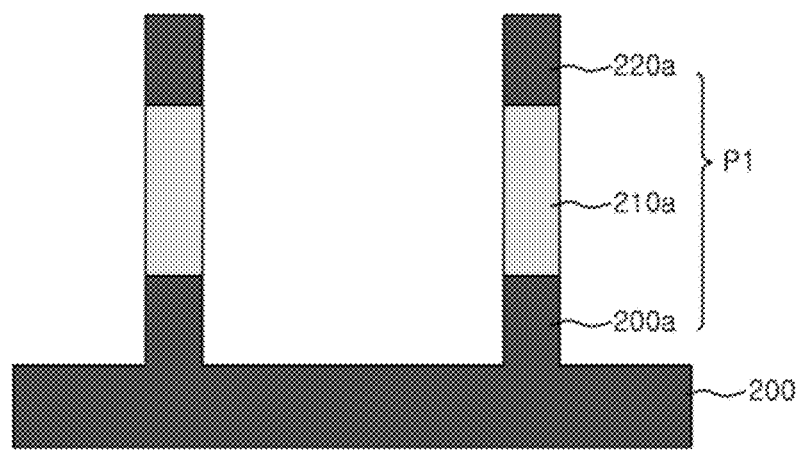

Referring to FIG. 3B, the second semiconductor layer 220, the first semiconductor layer 210, and a portion of the semiconductor substrate 200 are patterned to form a preliminary pillar P1. The reference numerals 220a, 210a, and 200a denote a patterned second semiconductor layer, a patterned first semiconductor layer, and a patterned portion of the semiconductor substrate, respectively. The preliminary pillar P1 may extend to have a certain length. That is, the preliminary pillar P1 may have a line structure.

Figure 3C:
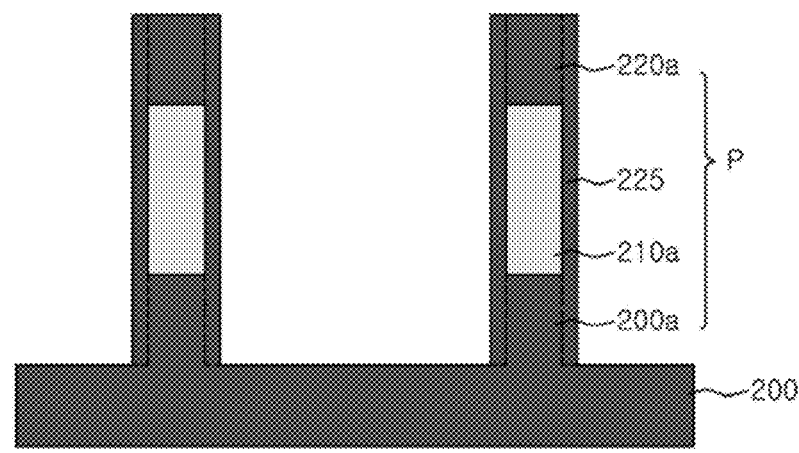
Figure 3D:
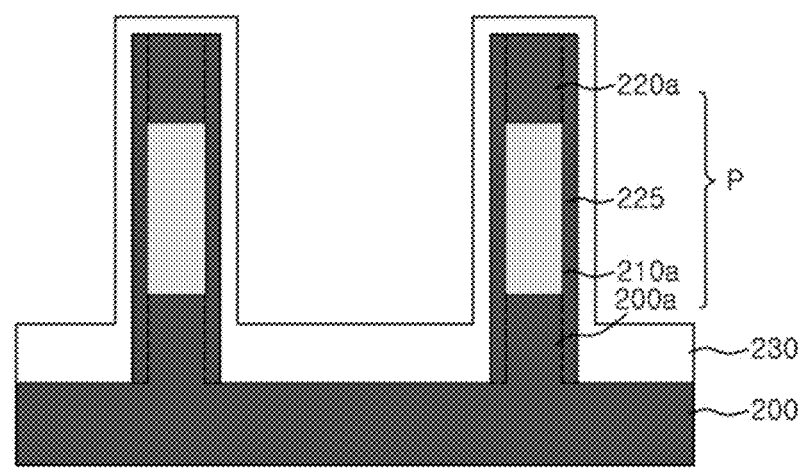
Figure 4:
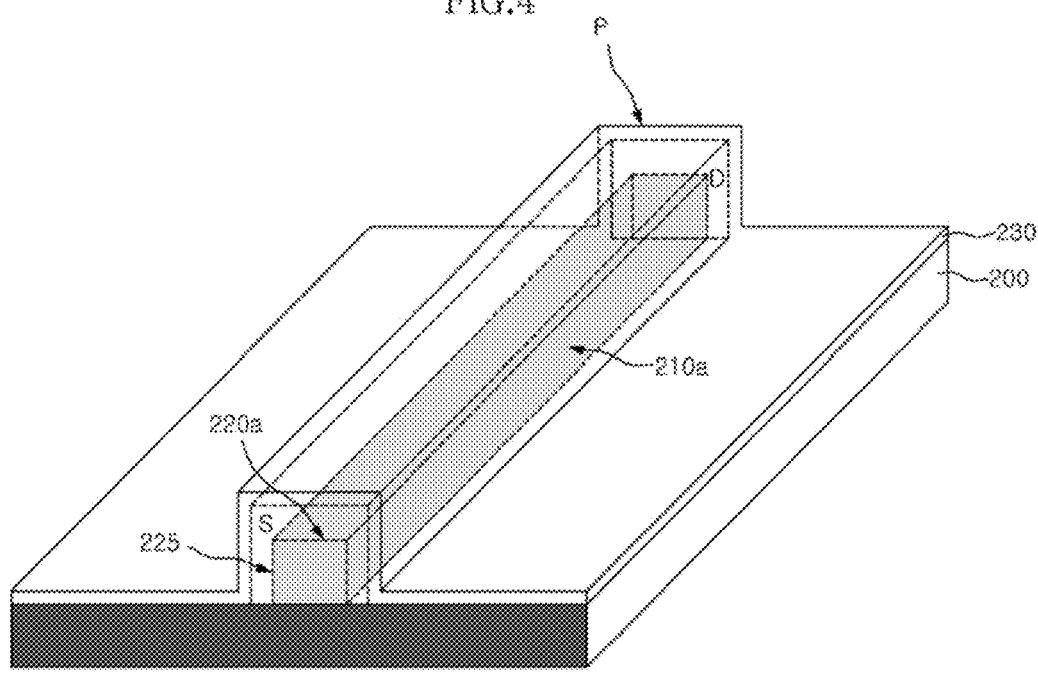
FIG. 4 is a perspective view illustrating a PMOS transistor having a fin gate according to another embodiment of the inventive concept.

Referring to FIGS. 3C and 4, a third semiconductor layer 225 having a lattice constant larger than that of the patterned first semiconductor layer 210a may be formed on an outer circumference of the preliminary pillar P1 referenced in FIG. 3B. For example, the third semiconductor layer 225 may be formed of the same material as that of the semiconductor substrate 200 and the patterned second semiconductor layer 220a, such as, a silicon (Si) material. The third semiconductor layer 225 may be formed using an epitaxial growth method or a deposition and spacer forming method. According to the formation of the third semiconductor layer 225, an entire surface of the patterned first semiconductor layer 210a may be enclosed with a semiconductor material having a lattice constant larger than that of the patterned first semiconductor layer 210a, for example, a silicon (Si) material. Thus, an active pillar P having a 3D transistor may be formed.

Figure 3E:
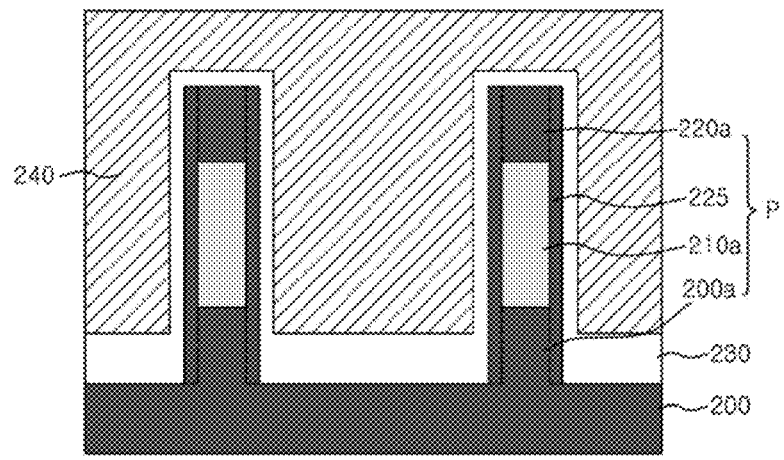

Referring to FIG. 3E a gate insulating layer 230 is formed by oxidizing the surface of the active pillar P and an exposed surface of the semiconductor substrate 200. In the embodiment, the gate insulating layer 230 is formed through an oxidation method, but the method of forming the gate insulating layer 230 is not limited thereto, and the gate insulating layer 230 may be formed through a deposition method. When the gate insulating layer 230 is formed through a deposition method, the gate insulating layer 230 may include a metal oxide layer such as a TaO layer, a TiO layer, a BaTiO layer, a BaZrO layer, a ZrO layer, a HfO layer, a LaO layer, an AlO layer, a YO layer, or a ZrSiO layer, or a nitride layer, or a combination layer thereof. The thickness of the gate insulating layer 230 formed on a surface of the semiconductor substrate 200 may be larger than or equal to that of the gate insulating layer 230 formed on the surface of the active pillar P.

Figure 5:
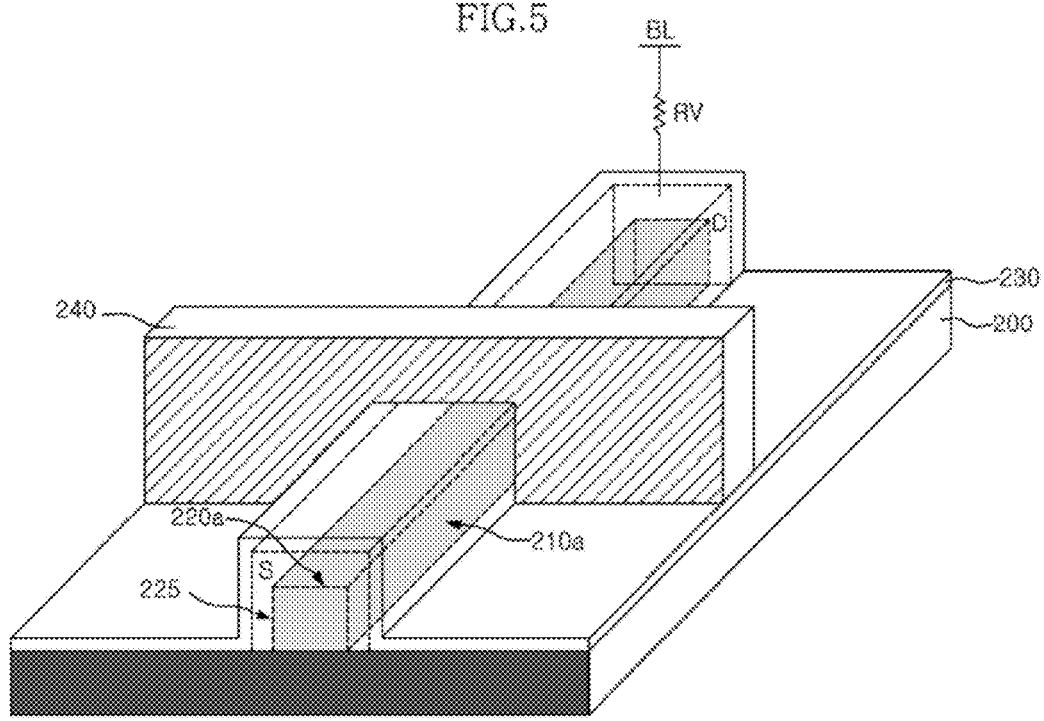
FIG. 5 is a perspective view illustrating a variable resistive memory device having a fin gate according to an embodiment of the inventive concept.

Referring to FIGS. 3E and 5, a gate conductive material may be deposited on the semiconductor substrate 200 in which the active pillar P is formed. For example, the gate conductive material may include at least one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, TaON, and doped polysilicon.

A predetermined portion of the gate conductive material may be patterned to form a fin gate 240. As illustrated in FIG. 5, the fin gate 240 may be formed to overlap portions of upper and lateral surfaces of the active pillar P covered with the gate insulating layer 230.

Second conductivity type impurities, for example, high concentration P type impurities may be implanted into the active pillar P at both sides of the fin gate 240 to form a source S at one side of the active pillar on the basis of the fin gate 240, and to form a drain D at the other side of the active pillar P. The source S and the drain D may be formed in a lightly doped drain (LDD) manner to reduce short channel effects such as gate-induced drain leakage (GIRL).

Next, a variable resistor Rv coupled to a bit line BL may be formed to be electrically coupled to the drain D through a general method. The variable resistor Rv may include various materials such as a PCMO layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM). Although not shown in the drawings, a heating electrode may be additionally interposed between the variable resistor Rv and the drain D.

Figure 6:
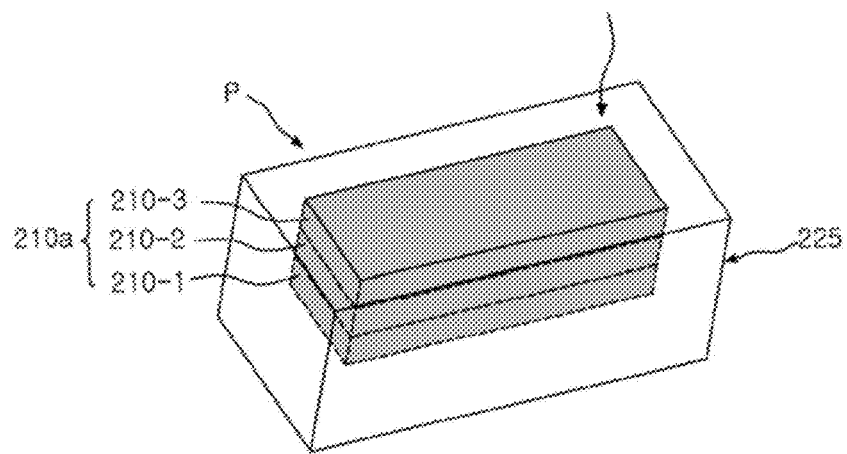
FIGS. 6 to 8 are perspective views illustrating pillars of semiconductor devices having a fin gate according to another embodiment of the inventive concept.

As illustrated in FIG. 6, a first semiconductor layer 210a of an active pillar P may include a first sub semiconductor layer 210-1, a second sub semiconductor layer 210-2, and a third sub semiconductor layer 210-3. When the first semiconductor layer 210a is formed of SiC, the first sub semiconductor layer 210-1 and the third sub semiconductor layer 210-3 may be a SiC layer (hereinafter, referred to as a C-low concentration-SiC layer) in which the carbon content (C) below the stoichiometric ratio of C in SiC, and the second sub semiconductor layer 210-2 may be an SiC layer (hereinafter, referred to as a C-high concentration-SiC layer) in which a content of C above the stoichiometric ratio of C in SiC is contained. When the content of C in the SiC layer is increased, the lattice constant of the SiC layer tends to decrease. Therefore, a material having the smallest lattice constant is formed in a substantial effective channel zone of the first semiconductor layer 210a to increase hole mobility in the channel. The sub semiconductor layers 210-1, 210-2, and 210-3 may be stacked through a deposition method.

Figure 7:
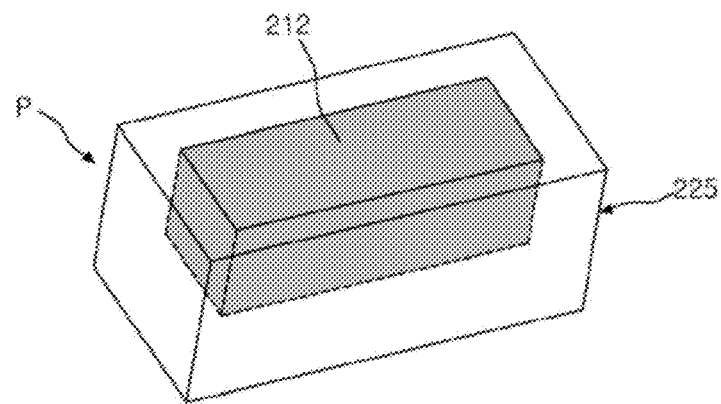

As illustrated in FIG. 7, an active pillar P may be formed to expose an upper surface of a first semiconductor layer 212. Thus, the fin gate (see 240 of FIG. 5) and the first semiconductor layer 212 may overlap each other with a gate insulating layer (not shown) being interposed therebetween.

Figure 8:
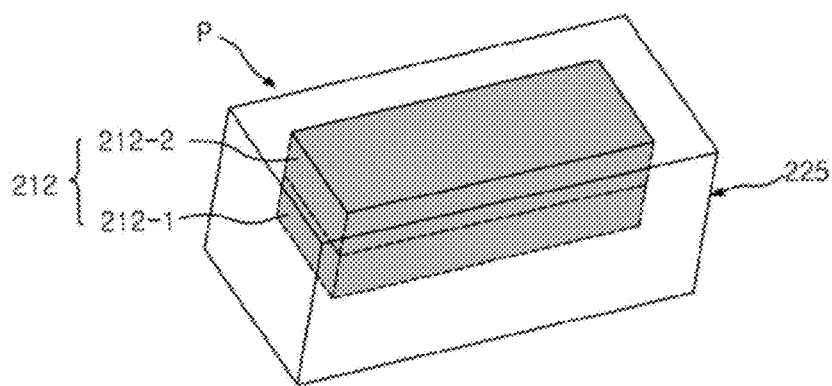

Further, when the active pillar P is formed to expose the upper surface of the first semiconductor layer 212, as illustrated in FIG. 7, the first semiconductor layer 212 may include a Ge-low concentration-SiGe layer 212-1 and a Ge-high concentration-SiGe layer 212-2, which are stacked as illustrated in FIG. 8.

According to the embodiment, in the active pillar having an inner portion and an outer portion, the inner portion in which a channel is to be substantially formed may be formed of a material having a lattice constant smaller than that of the outer portion. Thus, as compressive stress is applied to the inner portion of the active pillar, channel mobility of the PMOS transistor, that is, current drivability of the PMOS transistor may be considerably improved.

Further, a gate electric field is applied from three surfaces of the channel through use of the fin gate, and thus operation characteristics of the MOS transistor may be further improved.

The above embodiments of the present invention are illustrative and not limitative. Various alternatives and equivalents are possible. Therefore, the invention is not limited by the embodiments, nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
an active pillar formed on a semiconductor substrate, and including a first region and a second region surrounding at least one surface of the first region;
a fin gate extending to overlap an upper surface and a lateral surface of the active pillar; and
a gate insulating layer interposed between the active pillar and the fin gate,
wherein the first region of the active pillar is formed of a semiconductor layer having a lattice constant smaller than that of the second region of the active pillar,
wherein the second region includes Si,
wherein the first region includes SiC, AlN, GaN, ZnS, ZnO, ZnSe, CdS, BR or InN, and
wherein a stress for improving a current mobility is applied to the first region by a difference of the lattice constants between the first region and the second region.

2. The semiconductor device of claim 1, wherein the active pillar has a longitudinal axis extending in a direction substantially perpendicular to a longitudinal axis of the fin gate, and
the first region extends to a direction substantially parallel to the longitudinal axis of the active pillar.

3. The semiconductor device of claim 1, wherein the first region is an SiC layer and the first region is formed of a first C-low concentration-SiC layer that contains a content of C below a stoichiometric content of C in SiC, a C-high concentration-SiC layer that contains a content of C above the stoichiometric content of C in SiC, and a second C-low concentration-SiC layer that contains a content of C below the stoichiometric content of C in SiC.

4. The semiconductor device of claim 1, further comprising:
a P type source formed in the active pillar on one side of the fin gate; and
a P type drain formed in the active pillar on a second side of the fin gate.

5. The semiconductor device of claim 1, wherein the first region is formed to be exposed through the upper surface of the active pillar.

6. The semiconductor device of claim 5, wherein the semiconductor layer is a SiC layer and the semiconductor layer is formed of a first C-low concentration-SiC layer that contains a content of C below a stoichiometric content of C in SIC, a C-high concentration-SiC layer that contains a content of C above the stoichiometric content of C in SiC, and a second C-low concentration-SiC layer that contains a content of C below the stoichiometric content of C in SiC.

7. The semiconductor device of claim 6, wherein the C-high concentration-SIC layer is formed to be interposed between the first C-low concentration-SiC layer and the second C-low concentration-SiC layer.

8. A variable resistive memory device, comprising:
an active pillar including an inner region, an outer region formed to surround at least one surface of the inner region, and a P-type source and a P-type drain located at different sides of the inner region;
a fin gate extending to surround an upper surface and a lateral surface of the inner region of the active pillar;
a gate insulating layer interposed between the active pillar and the fin gate; and
a variable resistor electrically coupled to the drain,
wherein the active pillar is formed in such a manner that compressive stress is caused in a junction interface between the inner region and the outer region.

9. The variable resistive memory device of claim 8, wherein the inner region of the active pillar is formed of a material having a lattice constant smaller than that of the outer region.

10. The variable resistive memory device of claim 9, wherein the inner region includes one selected from the group consisting of SiC, AlN, GaN, ZnS, ZnO, ZnSe, CdS, BP, and InP, and
the outer region includes a silicon (Si) layer.

11. The semiconductor device of claim 3, further comprising:
a source formed in one side of the active pillar on the basis of the fin gate; and
a drain formed in other side of the active pillar on the basis of the fin gate.

12. The semiconductor device of claim 1, wherein the semiconductor substrate includes Si.

* * * * *